(12) United States Patent
Roohparvar

(10) Patent No.: US 6,285,608 B1
(45) Date of Patent: Sep. 4, 2001

(54) METHOD AND APPARATUS FOR USING SUPPLY VOLTAGE FOR TESTING IN SEMICONDUCTOR MEMORY DEVICES

(75) Inventor: Frankie Fariborz Roohparvar, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/045,250

(22) Filed: Mar. 20, 1998

(51) Int. Cl.[7] ................................................. G11C 7/00
(52) U.S. Cl. ................ 365/201; 365/185.23; 365/230.06
(58) Field of Search ............................. 365/201, 185.23, 365/189.09, 189.11, 230.06

(56) References Cited

U.S. PATENT DOCUMENTS

| | | | |
|---|---|---|---|
| 5,526,364 | 6/1996 | Roohparvar | 371/22.1 |
| 5,557,576 | 9/1996 | Roohparvar et al. | . |
| 5,568,426 | 10/1996 | Roohparvar et al. | 365/185.22 |
| 5,590,079 | * 12/1996 | Lee et al. | 365/201 |
| 5,594,694 | 1/1997 | Roohparvar et al. | 365/201 |
| 5,600,592 | * 2/1997 | Atsumi et al. | 365/185.23 |
| 5,610,866 | * 3/1997 | McClure | 365/201 |
| 5,657,282 | * 8/1997 | Lee | 365/201 |
| 5,826,607 | 10/1998 | Bushey et al. | 365/189.11 |
| 5,933,386 | 8/1999 | Walker et al. | 365/230.01 |

* cited by examiner

Primary Examiner—Vu A. Le
(74) Attorney, Agent, or Firm—Schwegman, Lundberg, Woessner & Kluth, P.A.

(57) ABSTRACT

A method and apparatus for using a supply signal, rather than a programming signal, to test bitline stress and multi-column programming in semiconductor memory devices is disclosed. The memory device includes a bitline driver that controls the voltage on the bitline. The method has the step of generating a programming signal and a supply signal. Both the programming signal and the supply signal are suitable for powering the memory device. The supply signal is provided to the bitline driver during the test-programming of the memory device. The memory device includes a bitline driver circuit which provides an output to a data line. The circuit isolates the programming signal from the data line, and the supply signal is placed in electrical communication with the data line.

31 Claims, 3 Drawing Sheets

METHOD AND APPARATUS FOR USING SUPPLY VOLTAGE FOR TESTING IN SEMICONDUCTOR MEMORY DEVICES

FIELD OF THE INVENTION

The present invention relates to semiconductor memory devices. More particularly, the present invention relates to a method and apparatus for using the supply voltage as a power source for bitline stress and multicolumn testing in semiconductor memory devices.

BACKGROUND

Electronic information handling or computer systems, whether large machines, microcomputers or small and simple digital processing devices, require memory for storing data and program instructions. Various memory systems have been developed over the years to address the evolving needs of information handling systems. Often, an information handling system will employ a variety of memory technologies, which may be grouped or distinguished, for the purposes herein, as mass storage devices and semiconductor memory.

Mass storage devices are generally nonvolatile and primarily used for information not frequently accessed. Mass storage devices are sometimes called "moving-surface memory" because they take the form of discs and tapes. Such mass storage devices have large capacities, great flexibility and low cost. Of course, moving-surface memories require relatively high power to operate and are prone to mechanical failures over the life of the devices. Also, such mass storage devices are referred to as "serial" or "sequential" memories, from which data is available only in the same sequence as it is originally stored. Consequently, such mass storage devices are hampered by longer access times that creates an inconvenience every time they are used.

In contrast, semiconductor memory is usually the most rapidly accessible memory and, thus, the one from which most instructions and recently-used data are stored. In a semiconductor memory, often the time required for storing and retrieving information generally is independent of the physical location of the information within the memory. Semiconductor memory typically store information in a large array of cells. A group of cells are electrically connected together by a bitline, or data line. An electrical signal is used to program a cell or cells. The electrical signal on the data line is controlled by the bitline driver circuit. Accordingly, a semiconductor memory device may include several groups of cells, each coupled together with a data line operated by a bitline driver. The electrical signal on the data line is supplied by a programming signal provided on semiconductor memory devices. The programming signal must supply a large amount of current on the data line.

Prior to shipping, a manufacturer will test its semiconductor memory devices. Among the tests performed include a bitline stress test. Generally, the bitline stress test is used to observe the effect of the electrical signal on the data line on cells not intended to be programmed. In the bitline stress test, a higher voltage than usual is applied to all of the cells in a group. During such a test, a leakage current is produced from the cells, and the total leakage current during a test can be quite substantial. Thus, in order to perform this test, a larger than usual amount of current is required. Other tests require that multiple groups of cells are programmed at the same time. These tests require a large amount of current which is itself multiplied by the number of groups programmed in parallel.

The large amount of current required for these tests can have a deleterious effect on the circuitry of the memory device. For example, in flash memory devices, a significant type of semiconductor memory device, the source of the programming signal is often on the opposite side of the chip from the bitline driver. A wide line able to supply large currents is required to travel a relatively great distance in order to provide the programming signal to the bitline driver. The amount of current carried by the line and the distance the current is required to travel effects electromigration issues that contribute to signal loss in the line and unwanted electrical interference in the memory device. Also, many of the relatively delicate circuitry elements are adversely affected by the large amounts of currents during testing of the device.

SUMMARY OF THE INVENTION

The present invention relates to a method for using a supply signal, rather than a programming signal, to test bitline stress and multicolumn programming in semiconductor memories. Also, the present invention relates to a memory device which makes use of the supply signal to test bitline stress and multicolumn programming. The present invention, in various aspects, employs the high currents as in the prior art. The present invention, however, provides for a power source that is proximate the relevant circuitry. Thus, the problem of electromigration encountered in the prior art is reduced.

One aspect of the present invention is a method for testing bitline stress in a memory device having a bitline driver. The bitline driver controls the voltage on the bitline, or data line. The method in this aspect includes the step of generating a programming signal and a supply signal. Both the programming signal and the supply signal are suitable for powering the memory device. The supply signal is provided to the bitline driver during the test-programming of the memory device. Further features of this aspect of the invention include providing a nonvolatile memory device having a plurality of cells associated with the data line and the bitline driver.

Another aspect of the present invention is a memory device suitable for testing bitline stress in the above-described manner. A programming signal and a supply signal provide power to the memory device. The memory device includes a bitline driver circuit which provides an output to a data line. The circuit isolates the programming signal from the data line, and the supply signal is placed in electrical communication with the data line.

The present invention in its various aspects includes several advantages over the prior art. Among these advantages is that the supply signal provided to the bitline driver is set with a larger degree of precision than in the prior art. This larger degree of precision provides for more accurate testing procedures than in the prior art. Also, the present invention makes use of the structure preferred for general operation of the device, and does not require a modification to the size of the lines providing the programming signal for the limited purpose of testing the device, as in the prior art. The lines providing the supply signal are typically larger than the lines providing the programming signal. The present invention employs the existing and larger supply signal lines. Furthermore, the use of the larger capacity supply signal, as compared with the capacity of the programming signal, greatly reduces a drop in voltage across the circuit elements follower as a result of the large currents flowing through them.

DETAILED DESCRIPTION OF THE PREFERRED EMBODIMENTS

Figure 1:
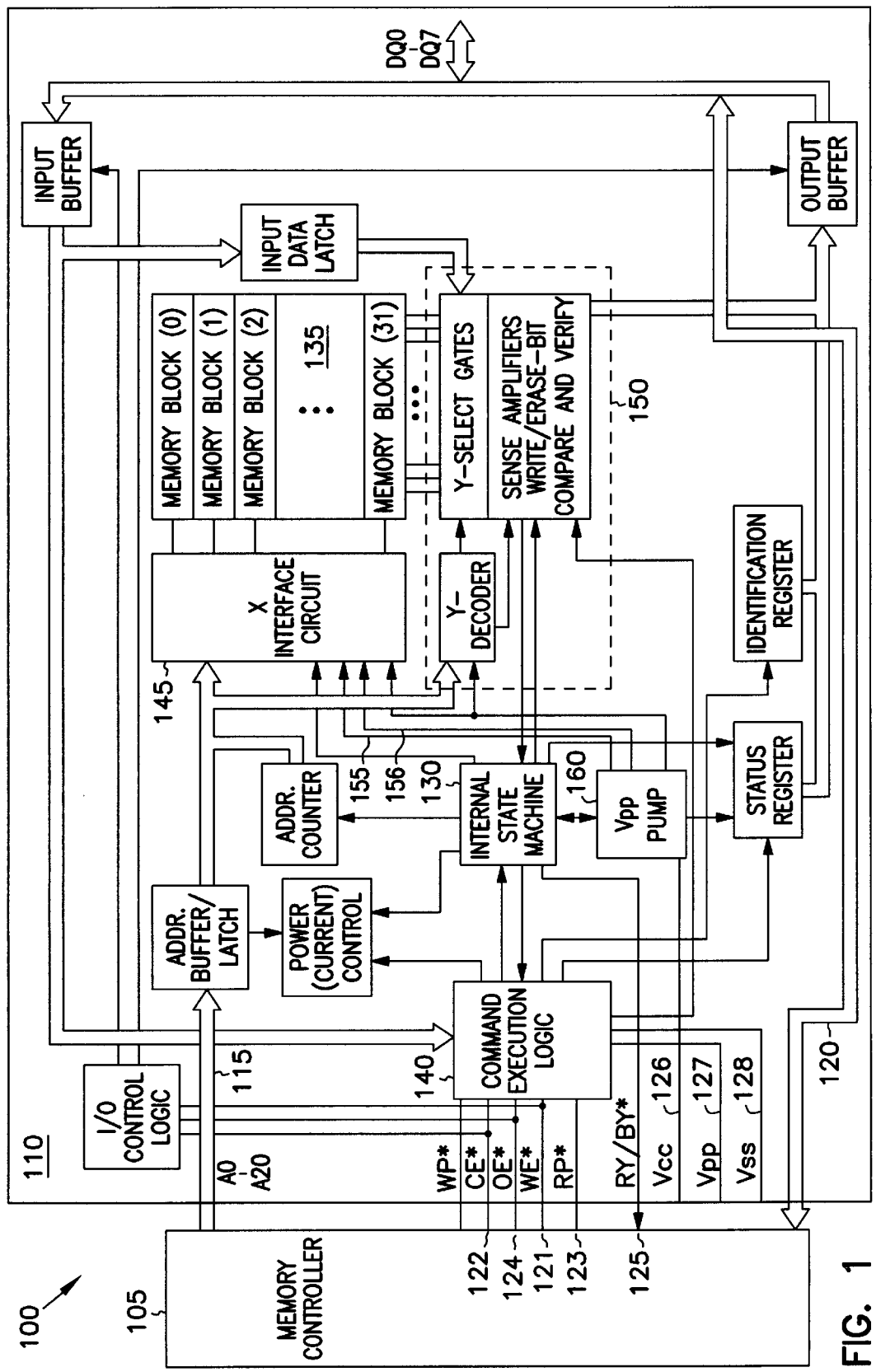
FIG. 1 shows a schematic diagram illustrating generally a memory system embodying features of the present invention.

In the following detailed description, reference is made to the accompanying drawings which form a part hereof, and in which is shown, by way of illustration, specific embodiments in which the invention may be practiced. In the drawings, like numerals describe substantially similar components throughout the several views. The embodiments are described in sufficient detail to enable those skilled in the art to practice the invention. Other embodiments may be used and logical, structural, and electrical changes may be made without departing from the scope of the present invention.

The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims and their equivalents.

FIG. 1 is a schematic diagram illustrating generally, by way of example, but not by way of limitation, one embodiment of a memory system 100 embodying features of the present invention. Memory system 100 includes memory controller 105 and memory integrated circuit (IC) 110. Controller 105 includes a microprocessor or any other controller 105 providing interface signals to the memory IC 110, as described below. Such interface signals include addressing signals, provided at address lines 115, and data signals, communicated at data lines 120. Other interface signals provided by controller 105 include write enable (WE*) at node 121, chip enable (CE*) at node 122, reset/power-down (RP*) at node 123, and output enable (OE*) at node 124, all of which are active low signals. Memory IC 110 provides a status signal (RY/BY*) at node 125 to controller 105 to indicate the status of internal state machine 130. Memory IC 110 also receives a positive power supply voltage ($V_{cc}$) at node 126, a write/erase supply (or programming) voltage ($V_{PP}$) at node 127, and a reference voltage such as substrate ground voltage ($V_{SS}$) at node 128 (e.g., approximately 0 Volts).

In the embodiment of FIG. 1, memory IC 110 includes a memory cell array 135 of floating gate transistor memory cells arranged in 32 memory cell blocks. Each memory cell block in memory cell array 135 contains 64 kilobytes of floating gate transistor memory cells. Data stored in each memory cell block is erased independently, as described below, without disturbing data stored in other memory cell blocks. A command execution logic module 140 receives the above-described interface signals from controller 105. Command execution logic module 140 controls internal state machine 130, which provides write and block erase timing sequences to memory cell array 135 through X-interface circuit 145 and Y-interface circuit 150.

Y-interface circuit 150 provides access to individual memory cells through data lines in memory cell array 135. Data lines in the Y-interface circuit are connected to a bitline driver circuit, discussed below with reference to FIG. 2. Y-interface circuit 150 includes a Y-decoder circuit, Y-select gates, sense-amplifiers, and write/erase bit compare and verify circuits. X-interface circuit 145 provides access to rows of memory cells through wordlines in memory cell array 135, which are electrically coupled to control gates (also called select gates) of floating gate transistors in memory cell array 135. X-interface circuit 145 includes decoding and control circuits for erasing individual blocks of memory cells in memory cell array 135.

Figure 2:
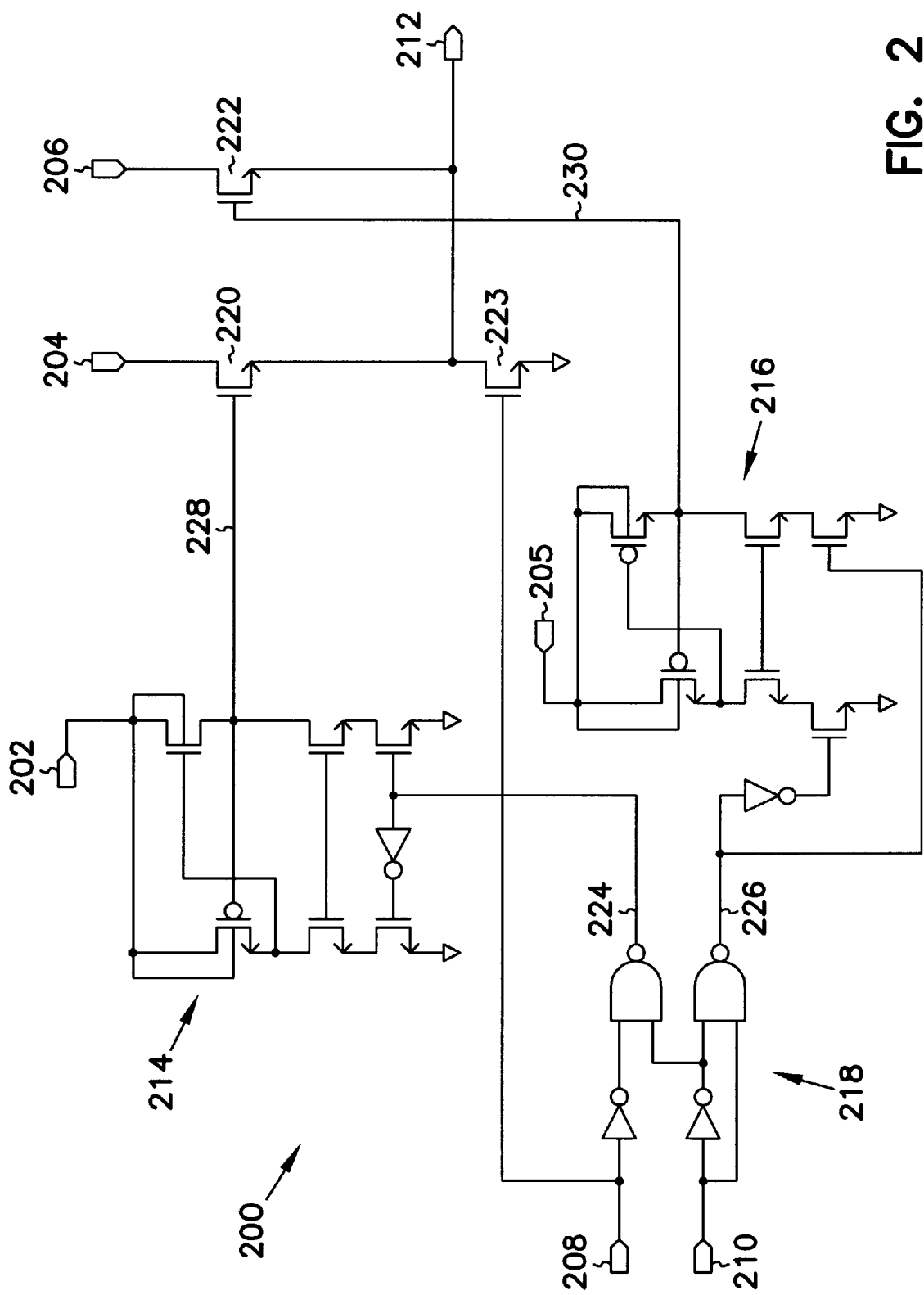
FIG. 2 shows a schematic diagram illustrating a bitline driver circuit, a portion of the memory system shown in FIG. 1, embodying features of the present invention.

FIG. 2 shows a bitline driver circuit 200, embodying features of the present invention. Power is supplied to the bitline driver during normal operation from nodes 202 and 204. For example, node 202 can be connected to Vpp and node 204 can be connected to a charge pump. In another example, node 202 can be connected to an analog reference voltage and node 204 is connected to Vpp. Node 205 is preferrably connected to Vpp, and, in a preferred embodiment is connected to either node 202 or node 204, whichever node is connected to Vpp. Node 206 is connected to the supply voltage, or Vcc. The bitline driver 200 receives a bitline data signal at node 208 and a quad programming signal at node 210. The bitline driver 200 provides an output at data line 212. The circuitry of the bitline driver 200 includes a first level shifter 214, a second level shifter 216, a logic circuit 218, a first transistor 220, a second transistor 222, and a third transistor 223. When node 202 is connected to an analog reference voltage as the example described above, transistor 220 operates as a source follower. In the embodiment described, the transistors 220, 222, and 223, are n-channel devices.

The elements of the bitline driver 200 are connected together as shown. The logic circuit 218 receives signals from nodes 208 and 210 representative of the bitline data signal and quadprogramming signal, respectively, and provides an output over line 224 to the first level shifter 214, and provides an output over line 226 to the second level shifter 216. The first level shifter 214 provides an output over line 228 to the gate of the first transistor 220. The second level shifter 216 provides an output over line 230 to the gate of the second transistor 222. The data line 212 is connected to the sources of the first and second transistors 220, 222, and the drain of the third transistor 223. The bitline data signal, at node 208, is provided to the gate of the third transistor 223. The drain of the second transistor 222 is connected to node 206.

The operation of the bitline driver circuit 200 is described below. The first level shifter 214 and first and third transistors 220, 223, operate in a known fashion during the general operation of the memory device 110. For example, when nodes 208 and 210 are at logic zero, the first transistor 220 is activated. The first transistor 220 acts like a switch to provide a signal on the data line 212. Node 204 is connected as described above, such as to a charge pump (not shown) in a first embodiment, or to a source follower (not shown) in a second embodiment, which generates the programming voltage from the bitline driver 200.

The charge pump and the source follower in a typical design, however, cannot supply the necessary current during a test mode. Accordingly, the bitline driver 200 is configured to make use of the supply voltage from node 206 during test modes. Specifically, when a signal representative of logic zero is provided to node 208, the bitline driver 200 turns on the data line 212. In addition, when a signal representative of logic one is provided to node 210, the effect is activate the second transistor 222 and turn off the first transistor 220. The second level shifter 216 functions to change zero volts to the supply voltage into zero volts to twelve volts. Thus, the second transistor 222 is activated when twelve volts are provided to its gate. When the second transistor 222 is activated, the supply voltage signal which provides a suitable amount of current is provided to the data line 212. In addition to providing a suitable amount of current, the supply voltage can be set externally to provide the appropriate voltage to the data line 212 during the test mode.

The above described bitline driver device includes several advantages over the prior art. For example, typical integrated circuit design provides for a larger signal line for the supply voltage than the programming voltage, and the described embodiment makes use of the larger line to more easily provide the suitable amount of current. Also, the supply signal line is proximate the bitline driver in many designs, and the described embodiment does not require a remarkable reroute of the current source when testing the device. Accordingly, this feature helps reduce the unwanted effects of electromigration.

Figure 3:
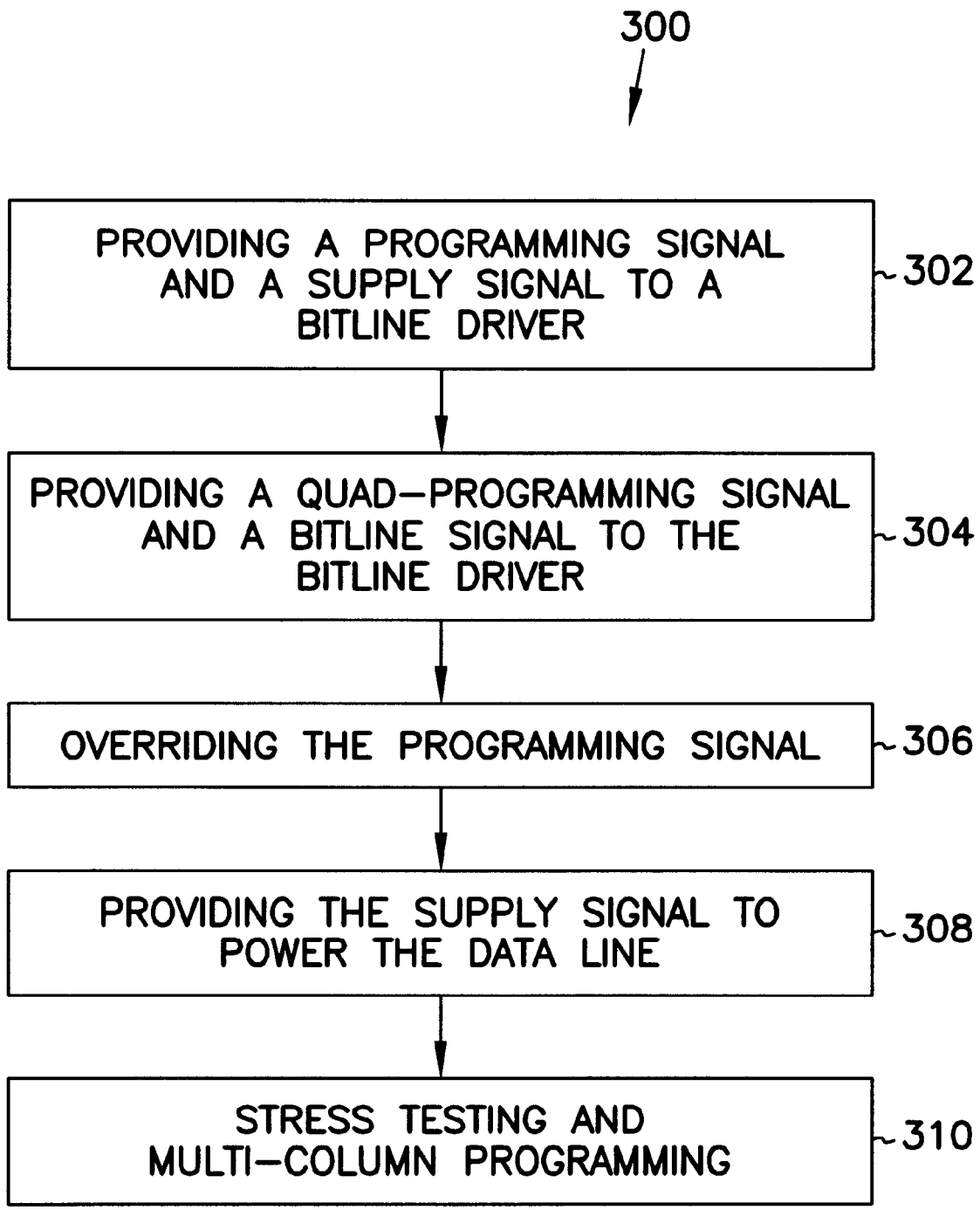
FIG. 3 shows a flow chart of a method embodying features of the present invention for using the memory system shown in FIG. 1.

FIG. 3 shows a flow chart of a method for using the memory system shown in FIG. 1, and particularly the bitline driver circuit 200 of FIG. 2, when testing the system 300. One step in the method involves providing both a programming signal with a programming voltage and a supply signal with a supply voltage to the bitline driver 302. In connection with this step, the supply voltage is externally set to a predetermined value which is preferably between 5.5 to 6.0 volts in the preferred embodiment. The programming signal is typically provided by a charge pump or through a source follower, the voltage set in the range of 5.5 to 6.0 with a much more limited current capacity. Another step is providing a quadprogramming and bitline data signal to the bitline driver 304. For the testing mode, the quadprogramming signal and the bitline data signal are used to override the programming signal from the data line with the supply signal 306. In the preferred embodiment, this involves setting the bitline data signal to logic zero and setting the quadprogramming signal to logic one. This combination, when used in connection with the bitline driver 200, serves to "switch off" the programming signal and "switch on" the supply signal to the data line. Thus, the supply signal with its large current capacity is employed to power the data line 308. In this manner, bitline stress testing and multicolumn programming can proceed in a known manner with a carefully monitored voltage and a more than adequate supply of current 310.

The above described method includes several advantages over the prior art. Among these advantages is that the supply signal provided to the bitline driver is set with a larger degree of precision than in the prior art. This larger degree of precision provides for more accurate testing procedures than in the prior art. Furthermore, the use of the larger capacity supply signal, as compared with the capacity of the programming signal, greatly reduces drops in voltage across circuit elements such as the source follower as a result of the large currents flowing through it.

It is to be understood that the above description is intended to be illustrative, and not restrictive. Many other embodiments will be apparent to those of skill in the art upon reviewing the above description. The invention should, therefore, be determined with reference to the appended claims, along with the full scope to which such claims are entitled.

What is claimed is:

1. A method for testing a memory device having a bitline driver and suitable for test-programming, the method comprising the steps of:

providing a programming signal and a supply signal, wherein the programming signal and supply signal are suitable for powering the memory device; and providing the supply signal to the bitline driver during test-programming of the memory device.

2. The method of claim 1 wherein the supply signal has a corresponding voltage.

3. The method of claim 2 wherein the programming signal is suitable for powering the bitline driver.

4. The method of claim 2, and further comprising the step of setting the corresponding voltage of the supply signal to a value of between about 5.5 and about 6.0 volts.

5. The method of claim 1 wherein the bitline driver includes a data line, and the step of providing the supply signal to the bitline driver includes the step of providing the supply signal to the data line.

6. The method of claim 5 wherein the programming signal is in selectable electrical communication with the data line, the method further comprising the steps of:

providing a quadprogramming signal and bitline data signal to the bitline driver; and overriding the programming signal to the data line.

7. The method of claim 6 wherein the step of overriding the programming signal includes providing a selected combination of logic values with the quadprogramming signal and bitline data signal to provide the supply signal to the data line and generally isolate the programming signal from the data line.

8. The method of claim 7, and further comprising a general-mode combination of logic values with the quadprogramming signal and bitline data signal to provide the programming signal to the data line and generally isolating the supply signal from the data line.

9. A method of testing bitline stress in a nonvolatile memory device having a plurality of cells corresponding with a bitline driver, the bitline driver having a data line with a corresponding data line voltage, and the cells of the memory device suitable for test-programming, the method comprising the steps of:

providing a programming signal and a supply signal; and providing the supply power signal to the data line while test-programming the cells.

10. The method of claim 9 wherein the programming signal is in selectable electrical communication with the data line, the method further comprising the steps of:

providing a quadprogramming signal and bitline data signal to the bitline driver; and overriding the programming signal to the data line.

11. The method of claim 10 wherein the step of overriding the programming signal includes providing a selected combination of logic values with the quadprogramming signal and bitline data signal to provide the supply signal to the data line and generally isolate the programming signal from the data line.

12. A method for testing a bitline driver in a memory device, the bitline driver having a data line, the method comprising the steps of:

providing a programming signal and a supply signal, each suitable for providing power to the memory device, wherein the programming signal is in selectable electrical communication with the data line;
setting the supply signal to a predetermined value;
isolating the programming signal from the data line; and
providing the supply signal to the data line.

13. The method of claim 12 wherein not more than one of the programming signal and the supply signal is in electrical communication with the data line at a time.

14. The method of claim 12 wherein the data line includes a corresponding data line voltage, and further comprising the step of measuring the data line voltage.

15. The method of claim 12 wherein the supply signal includes a supply signal voltage, and wherein the step of setting the supply signal includes setting the supply signal voltage to a value of between about 5.5 to about 6.0 volts.

16. A method for testing a memory device having a bitline driver, the bitline driver having a corresponding data line, the method comprising the steps of:
providing a programming signal and a supply signal, wherein the supply signal includes a corresponding supply voltage, wherein the programming signal and supply signal are suitable for powering the memory device, and wherein the programming signal is in selectable electrical communication with the data line;
setting the supply voltage to a selected value;
generating a logic signal having a plurality of corresponding voltages each indicative of logic value;
generally isolating the programming signal from the data line with a selected logic value of the logic signal; and
providing the supply signal to the data line with the selected logic value of the logic signal.

17. The method of claim 16 wherein the step of generating a logic signal includes the step of providing a quadprogramming signal and bitline data signal to the bitline driver.

18. The method of claim 16 wherein not more than one of the programming signal and the supply signal is in electrical communication with the data line at a time.

19. A memory device, the memory device suitable for receiving a programming signal voltage and a supply signal voltage, the memory device comprising:
a data line, wherein the data line is suitable for selectively receiving the programming signal voltage or the supply signal voltage;
a supply signal line in selectable electrical communication with the data line and suitable for connection to the supply signal voltage, the supply signal line for providing the supply signal voltage to the data line to stress-test the data line; and
a bitline driver circuit operably coupled to the data line for controlling the supply signal voltage on the data line and for selectively providing the programming signal voltage to the data line in normal operation and for selectively providing the supply signal voltage to the data line in test mode operation.

20. The memory device of claim 19 wherein the bitline driver circuit controls the programming signal on the data line.

21. A memory device, the memory device suitable for receiving a programming signal and a supply signal, the memory device comprising:
a data line, wherein the data line is suitable for selectively receiving the programming signal;
a supply signal line in electrical communication with the data line and suitable for connection to the supply signal, the supply signal line for providing the supply signal to the data line;
a bitline driver circuit operably coupled to the data line for controlling the supply signal on the data line; and
wherein the bitline driver circuit includes a logic circuit for selectively providing one of the programming signal and the supply signal to the data line.

22. The memory device of claim 21 wherein the logic circuit receives inputs including a quadprogramming signal and a bitline data signal.

23. A memory device receiving a power signal and a programming signal, the memory device comprising:
a plurality of memory cells for storing data therein, the memory cells arranged in memory blocks, wherein the data in each memory block is erased independently and without affecting data in other memory blocks, and wherein at least some of the memory cells are operably coupled to a data line; and
a bitline driver circuit operably coupled to the data line, the power signal, and the programming signal;
wherein the bitline driver circuit includes a power circuit selectively providing the power signal to the data line.

24. The memory device of claim 23 wherein the power circuit includes:
a switch operably connected to and between the power signal and the data line; and
a logic circuit suitable for receiving an input and selectively operating the switch.

25. The memory device of claim 24 wherein the logic circuit includes a level shifter operably coupled to the input and the switch.

26. The memory device of claim 25 wherein the level shifter provides a switch signal responsive to the input in order to operate the switch.

27. A memory system, comprising:
inputs for receiving a programming signal voltage and a supply signal voltage, each suitable for powering at least a portion of the memory system;
a memory circuit in electrical communication with the programming signal voltage and the supply signal voltage, the memory circuit having:
a plurality of memory cells operably coupled to a data line;
a bitline driver circuit operably coupled to the data line, the bitline driver circuit for controlling an electrical signal provided to the data line; and
wherein the supply signal is provided to the data line through the bitline driver circuit in test mode operation of the memory system and the programming signal voltage is provided to the data line through the bitline driver circuit in normal operation of the memory system.

28. The memory system of claim 27, and further comprising a memory controller operably coupled to the memory circuit, the memory controller for at least providing interface signals to the memory circuit over lines connected between the memory controller and the memory circuit.

29. The memory system of claim 28 wherein the memory controller includes a microprocessor.

30. The memory system of claim 29 wherein the interface signals include a write enable signal, a chip enable signal, a reset signal, and an output enable signal.

31. The memory system of claim 28 wherein the memory circuit provides a status signal to the memory controller.

* * * * *